(12) United States Patent
Hsiang et al.

(10) Patent No.: US 10,312,165 B1
(45) Date of Patent: Jun. 4, 2019

(54) MICRO LIGHTING DEVICE

(71) Applicant: ACER INCORPORATED, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 15/881,799

(22) Filed: Jan. 28, 2018

(30) Foreign Application Priority Data

Dec. 5, 2017 (TW) .............................. 106142619 A

(51) Int. Cl.
*H01L 21/66* (2006.01)
*H01L 33/62* (2010.01)
*H01L 25/075* (2006.01)

(52) U.S. Cl.
CPC .......... *H01L 22/22* (2013.01); *H01L 25/0756* (2013.01); *H01L 33/62* (2013.01)

(58) Field of Classification Search
CPC ...... H01L 22/22; H01L 25/0756; H01L 33/62
See application file for complete search history.

(56) References Cited

U.S. PATENT DOCUMENTS

| | | | | |
|---|---|---|---|---|
| 2012/0274212 A1* | 11/2012 | Yu | ....................... | H05B 33/0824 |
| | | | | 315/88 |
| 2014/0367705 A1* | 12/2014 | Bibl | ....................... | H01L 33/44 |
| | | | | 257/88 |
| 2015/0179876 A1* | 6/2015 | Hu | ......................... | H01L 33/06 |
| | | | | 257/1 |
| 2015/0380459 A1* | 12/2015 | Bono | ................ | H01L 31/02005 |
| | | | | 257/13 |
| 2016/0163765 A1* | 6/2016 | Hu | ........................ | H01L 27/156 |
| | | | | 257/93 |
| 2018/0007750 A1* | 1/2018 | Meitl | .................. | H01L 27/0288 |
| 2018/0197461 A1* | 7/2018 | Lai | ....................... | H01L 25/0753 |
| 2018/0233536 A1* | 8/2018 | Chang | .................. | H01L 27/156 |
| 2019/0006329 A1* | 1/2019 | Hashim | ................ | H01L 33/486 |

* cited by examiner

*Primary Examiner* — John P. Dulka
(74) *Attorney, Agent, or Firm* — Winston Hsu

(57) ABSTRACT

A micro lighting device includes a source line, a ground line, a main LED, and a redundant LED. The main LED includes a first electrode and a second electrode, and the redundant LED includes a third electrode and a fourth electrode. When the main LED is able to light up, the first electrode is electrically connected to the source line, the second electrode is electrically connected to the ground line, and at least one of the third electrode and the fourth electrode is electrically isolated from both the source line and the ground line. When the main LED is unable to light up, at least one of the first electrode and the second electrode is electrically isolated from both the source line and the ground line, the third electrode is electrically connected to the source line, and the fourth electrode is electrically connected to the ground line.

10 Claims, 8 Drawing Sheets

MICRO LIGHTING DEVICE

CROSS REFERENCE TO RELATED APPLICATION

This application claims priority of Taiwan Application No. 106142619 filed on 2017 Dec. 5.

BACKGROUND OF THE INVENTION

1. Field of the Invention

The present invention is related to a micro lighting device, and more particularly, to a micro lighting device with repair mechanism.

2. Description of the Prior Art

Compared to traditional incandescent bulbs, light-emitting diodes (LEDs) are advantageous in low power consumption, long lifetime, small size, no warm-up time, fast reaction speed, and the ability to be manufactured as small or array devices. In addition to outdoor displays, traffic signs, and liquid crystal display (LCD) backlight for various electronic devices such as mobile phones, notebook computers or personal digital assistants (PDAs), LEDs are also widely used as indoor/outdoor lighting devices in place of fluorescent of incandescent lamps.

The size of traditional LED arrays is the dimension of millimeters (mm). The size of micro LED arrays may be reduced to the dimension of micrometers ($\mu$m) while inheriting the same good performances regarding power consumption, brightness, resolution, color saturation, reaction speed, life time and efficiency. In a micro LED manufacturing process, a thin-film, miniaturized and array design is adopted so that multiple micro LEDs are fabricated in the dimension of merely 1-10 $\mu$m. Next, these micro LEDs are mass transferred to be disposed on another circuit board. Protection layers and upper electrodes may be formed in a physical deposition process before packaging the upper substrate. Since the manufacturing process of micro LEDs is very complicated, there is a need to improve manufacturing yield.

SUMMARY OF THE INVENTION

The present invention provides a micro lighting device including a source line, a ground line, a main luminescent device having a first electrode and a second electrode, and a redundant luminescent device having a third electrode and a fourth electrode. The first electrode is electrically connected to the source line and the second electrode is electrically connected to the ground line and at least one of the third electrode and the fourth electrode is electrically isolated from both the source line and the ground line when the main luminescent device is able to light up. At least one of the first electrode and the second electrode is electrically isolated from both the source line and the ground line, the third electrode is electrically connected to the source line and the fourth electrode is electrically connected to the ground line when the main luminescent device is unable to light up.

The present invention further provides a micro lighting device including a source line, a ground line, a main luminescent device having a first electrode and a second electrode, a redundant luminescent device having a third electrode and a fourth electrode, and a conductive material. The first electrode is electrically connected to the source line and the second electrode is electrically connected to the ground line when the main luminescent device is able to light up. Both the first electrode and the second electrode are electrically isolated from both the source line and the ground line when the main luminescent device is unable to light up. The redundant luminescent device is arranged to be disposed on the main luminescent device when the main luminescent device is unable to light up and the conductive material is used for electrically connecting the third electrode to the source line and for electrically connecting the fourth electrode to the ground line.

The present invention further provides a method of manufacturing and repairing micro lighting device. The method includes fabricating a main luminescent device which includes a first electrode and a second electrode and then transferring the main luminescent device to be disposed on a substrate, fabricating a redundant luminescent device which includes a third electrode and a fourth electrode and then transferring the redundant luminescent device to be disposed on the substrate, electrically connecting the first electrode to a source line, electrically connecting the second electrode to a ground line, and electrically isolating at least one of the third electrode and the fourth electrode from both the source line and the ground line when the main luminescent device is able to light up, and electrically isolating at least one of the first electrode and the second electrode from both the source line and the ground line, electrically connecting the third electrode to the source line, and electrically connecting the fourth electrode to the ground line when the main luminescent device is unable to light up.

The present invention further provides a method of manufacturing and repairing micro lighting device. The method includes fabricating a main luminescent device which includes a first electrode and a second electrode, fabricating a redundant luminescent device which includes a third electrode and a fourth electrode, transferring the main luminescent device to be disposed on a substrate, electrically connecting the first electrode to a source line and electrically connecting the second electrode to a ground line when the main luminescent device is able to light up, electrically isolating at least one of the first electrode and the second electrode from both the source line and the ground line when the main luminescent device is able to light up, disposing the redundant luminescent device on the main luminescent device, and disposing a conductive material for electrically connecting the third electrode to the source line and for electrically connecting the fourth electrode to the ground line.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
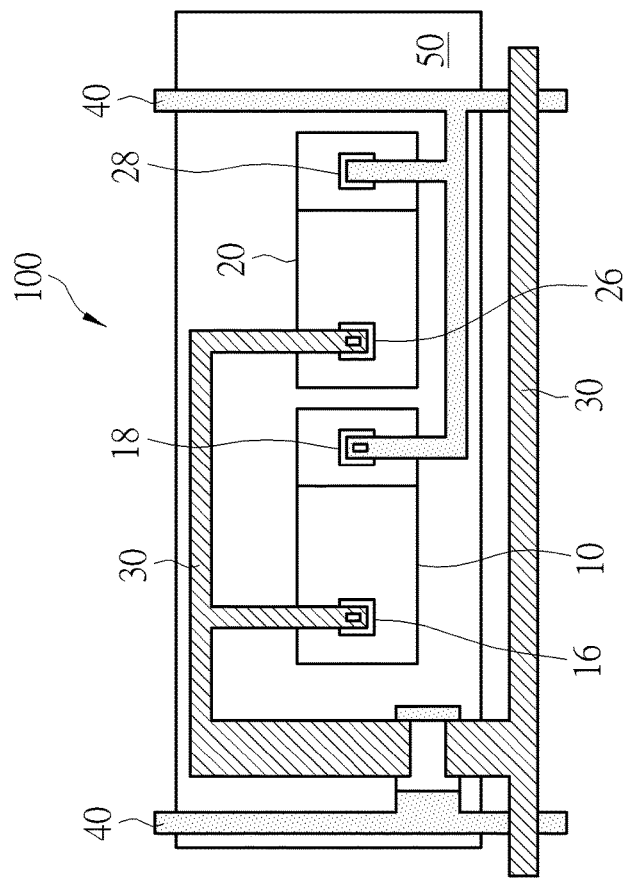
FIG. 1A is a structural diagram illustrating a micro lighting device according to an embodiment of the present invention.
Figure 1A:
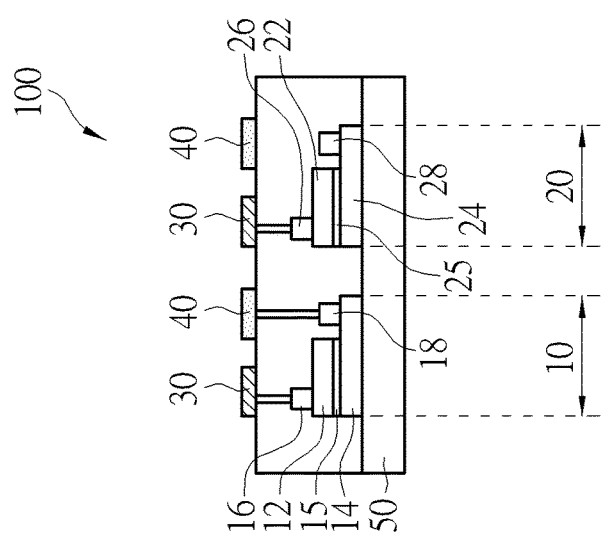

FIG. 1A is a structural diagram illustrating a micro lighting device 100 according to an embodiment of the present invention. A cross-sectional diagram of the micro lighting device 100 is depicted on the left side of FIG. 1A, and a top-view diagram of the micro lighting device 100 is depicted on the right side of FIG. 1A. The micro lighting device 100 with a thin-film, miniaturized and array design includes a plurality of main luminescent devices (only one main luminescent device 10 is depicted for illustrative purpose), at least one redundant luminescent device 20, a source line 30, and a ground line 40.

The main luminescent device 10 and the redundant luminescent device 20 are fabricated by combining P-type and N-type semiconductor materials before being mass transferred to a substrate 50. Under normal condition, when a positive voltage is applied to a P-electrode and a negative voltage is applied to an N-electrode, electrons flow from the N-region towards the P-region and holes flow from the P-region towards the N-region due to the forward-bias voltage. These electrons and holes then combine in the PN junction of the luminescent layer, thereby emitting photons of light. In an embodiment of the present invention, the main luminescent device 10 and the redundant luminescent device 20 may be micro LED devices. The main luminescent device 10 includes a P-type semiconductor layer 12, an N-type semiconductor layer 14, a P-electrode 16, an n-electrode 18, and a luminescent layer 15, wherein the P-electrode 16 is electrically connected to the source line 30 and the N-electrode 18 is electrically connected to the ground line 40. The redundant luminescent device 20 includes a P-type semiconductor layer 22, an N-type semiconductor layer 24, a P-electrode 26, an n-electrode 28, and a luminescent layer 25, wherein the P-electrode 26 is electrically connected to the source line 30 but the N-electrode 18 is electrically isolated from the ground line 40.

Figure 1B:
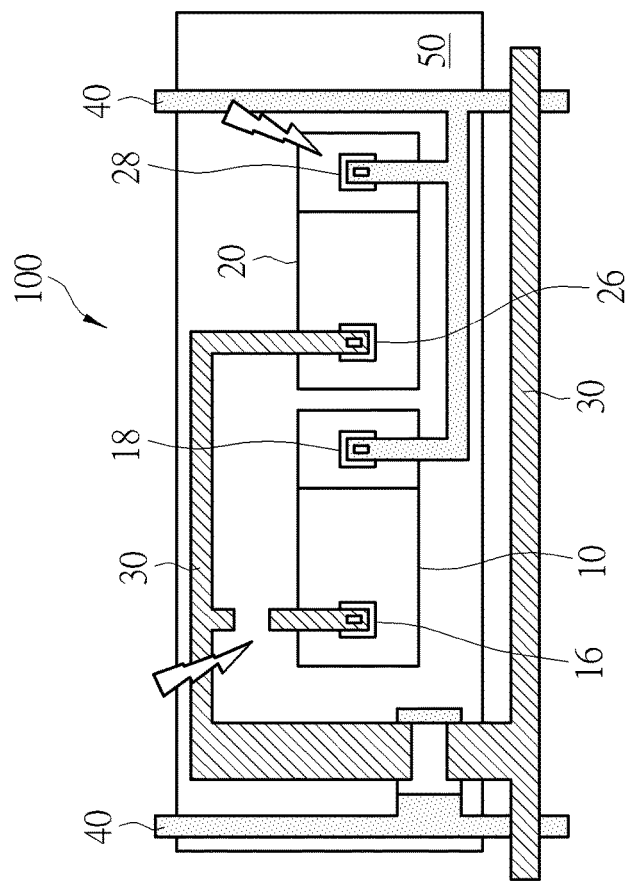
FIG. 1B is a diagram illustrating a method of repairing the micro lighting device according to an embodiment of the present invention.
Figure 1B:
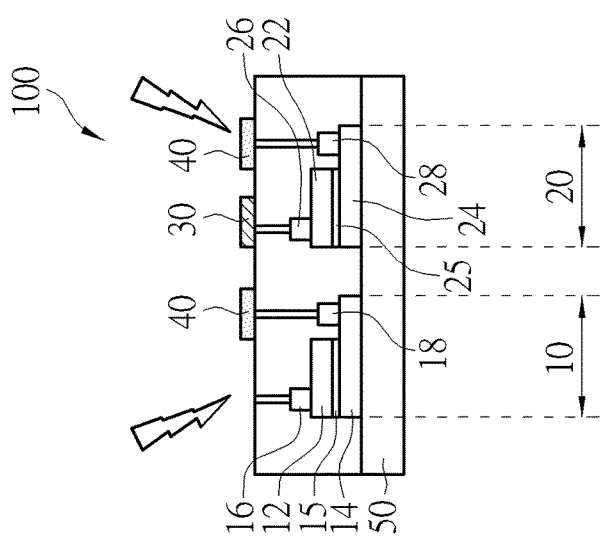

FIG. 1B is a diagram illustrating a method of repairing the micro lighting device 100 according to an embodiment of the present invention. A cross-sectional diagram of the repaired micro lighting device 100 is depicted on the left side of FIG. 1B, and a top-view diagram of the repaired micro lighting device 100 is depicted on the right side of FIG. 1B, wherein the repair locations are designated by flash signs. For illustrative purpose, it is assumed that the main luminescent device 10 in FIG. 1A somehow malfunctions and is unable to light up when applying voltages to the P-electrode 16 and the N-electrode 18, while the normal redundant luminescent device 20 is unable to light up because no voltage can be applied to the N-electrode 28. As depicted in FIG. 1B, the electrical connection between the P-electrode 16 of the main luminescent device 10 and the source line 30 may be cut off using laser cutting technique so as to prevent leakage current from the flawed main luminescent device 10. Next, the electrical connection between the N-electrode 28 of the redundant luminescent device 20 and the ground line 40 may be established using laser repair technique so that the normal redundant luminescent device 20 may light up to replace the flawed main luminescent device 10.

Figure 2A:
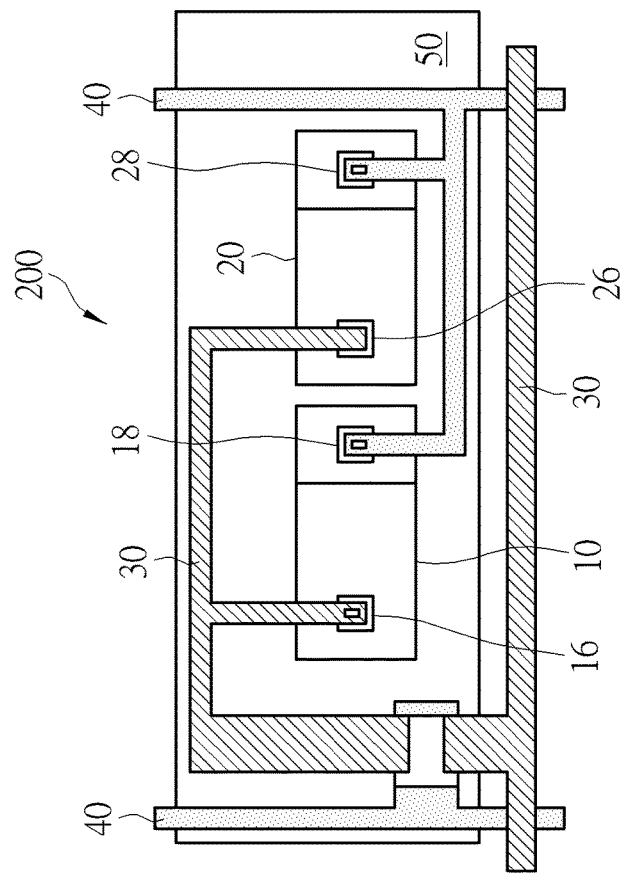
FIG. 2A is a structural diagram illustrating a micro lighting device according to another embodiment of the present invention.
Figure 2A:
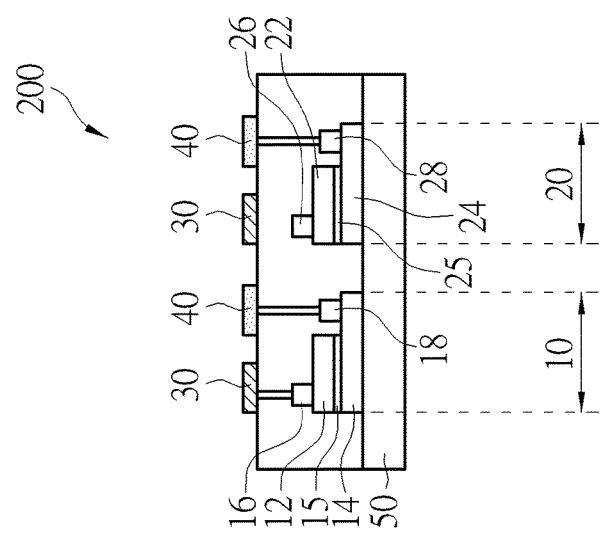

FIG. 2A is a structural diagram illustrating a micro lighting device 200 according to another embodiment of the present invention. A cross-sectional diagram of the micro lighting device 200 is depicted on the left side of FIG. 2A, and a top-view diagram of the micro lighting device 200 is depicted on the right side of FIG. 2A. The micro lighting device 200 with a thin-film, miniaturized and array design includes a plurality of main luminescent devices (only one main luminescent device 10 is depicted for illustrative purpose), at least one redundant luminescent device 20, a source line 30, and a ground line 40.

The main luminescent device 10 and the redundant luminescent device 20 are fabricated by combining P-type and N-type semiconductor materials before being mass transferred to a substrate 50. Under normal condition, when a positive voltage is applied to a P-electrode and a negative voltage is applied to an N-electrode, electrons flow from the N-region towards the P-region and holes flow from the P-region towards the N-region due to the forward-bias voltage. These electrons and holes then combine in the PN junction of the luminescent layer, thereby emitting photons of light. In an embodiment of the present invention, the main luminescent device 10 and the redundant luminescent device 20 may be micro LED devices. The main luminescent device 10 includes a P-type semiconductor layer 12, an N-type semiconductor layer 14, a P-electrode 16, an n-electrode 18, and a luminescent layer 15, wherein the P-electrode 16 is electrically connected to the source line 30 and the N-electrode 18 is electrically connected to the ground line 40. The redundant luminescent device 20 includes a P-type semiconductor layer 22, an N-type semiconductor layer 24, a P-electrode 26, an n-electrode 28, and a luminescent layer 25, wherein the N-electrode 18 is electrically connected to the ground line 40 but the P-electrode 26 is electrically isolated from the source line 30.

Figure 2B:
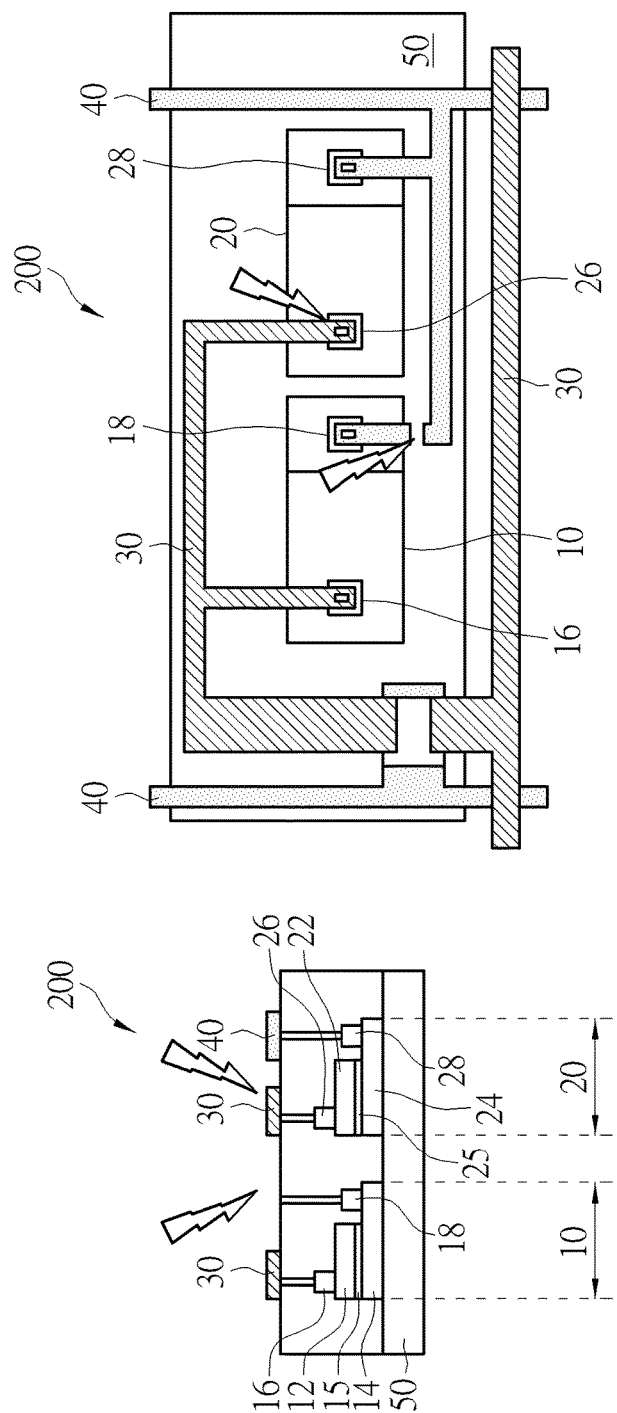
FIG. 2B is a diagram illustrating a method of repairing a micro lighting device according to another embodiment of the present invention.

FIG. 2B is a diagram illustrating a method of repairing the micro lighting device 200 according to an embodiment of the present invention. A cross-sectional diagram of the repaired micro lighting device 200 is depicted on the left side of FIG. 2B, and a top-view diagram of the repaired micro lighting device 200 is depicted on the right side of FIG. 2B, wherein the repair locations are designated by flash signs. For illustrative purpose, it is assumed that the main luminescent device 10 in FIG. 2A somehow malfunctions and is unable to light up when applying voltages to the P-electrode 16 and the N-electrode 18, while the normal redundant luminescent device 20 is unable to light up because no voltage can be applied to the P-electrode 26. As depicted in FIG. 2B, the electrical connection between the N-electrode 18 of the main luminescent device 10 and the ground line 40 may be cut off using laser cutting technique so as to prevent leakage current from the flawed main luminescent device 10. Next, the electrical connection between the P-electrode 26 of the redundant luminescent device 20 and the source line 30 may be established using laser repair technique so that the normal redundant luminescent device 20 may light up to replace the flawed main luminescent device 10.

Figure 3A:
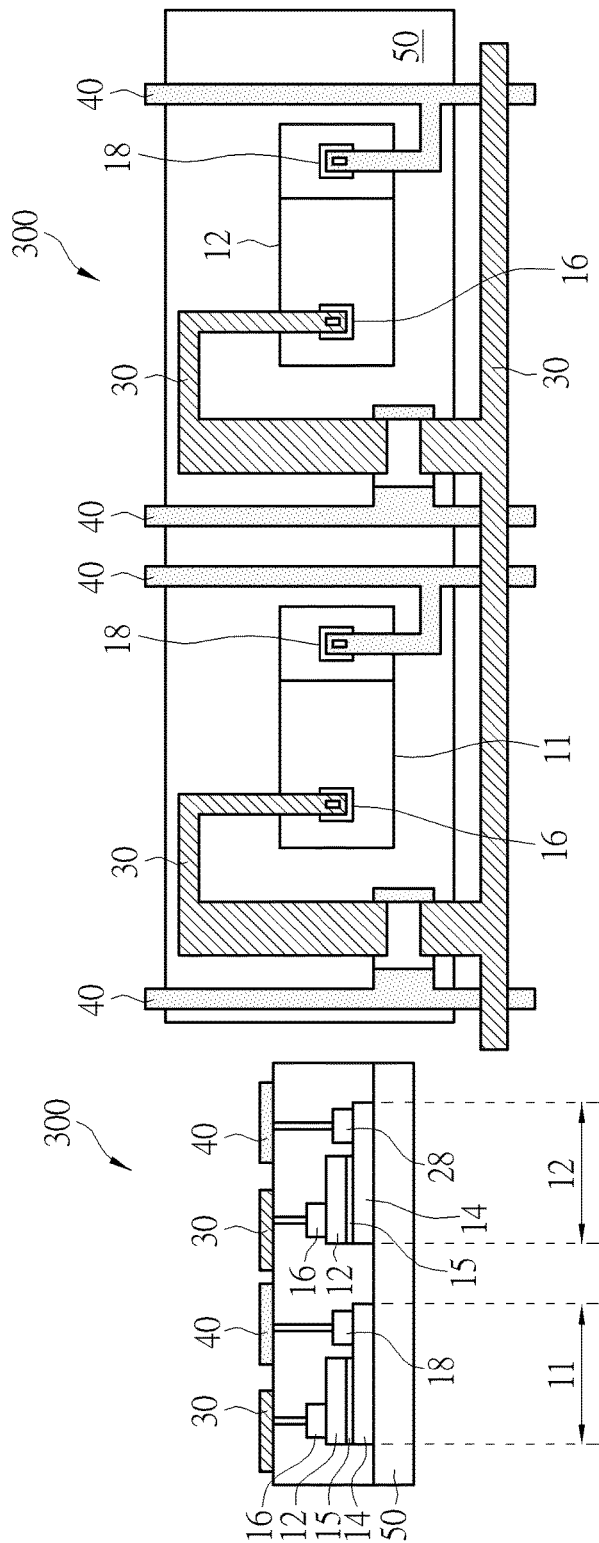
FIG. 3A is a structural diagram illustrating a micro lighting device according to another embodiment of the present invention.

FIG. 3A is a structural diagram illustrating a micro lighting device 300 according to another embodiment of the present invention. A cross-sectional diagram of the micro lighting device 300 is depicted on the left side of FIG. 3A, and a top-view diagram of the micro lighting device 300 is depicted on the right side of FIG. 3A. The micro lighting device 300 with a thin-film, miniaturized and array design includes a plurality of main luminescent devices (only two main luminescent devices 11 and 12 are depicted for illustrative purpose), a source line 30, and a ground line 40.

The main luminescent devices 11 and 12 are fabricated by combining P-type and N-type semiconductor materials before being mass transferred to a substrate 50. Under normal condition, when a positive voltage is applied to a P-electrode and a negative voltage is applied to an N-electrode, electrons flow from the N-region towards the P-region and holes flow from the P-region towards the N-region due to the forward-bias voltage. These electrons and holes then combine in the PN junction of the luminescent layer, thereby emitting photons of light. In an embodiment of the present invention, the main luminescent devices 11 and 12 may be micro LED devices each including a P-type semiconductor layer 12, an N-type semiconductor layer 14, a P-electrode 16, an n-electrode 18, and a luminescent layer 15, wherein the P-electrode 16 is electrically connected to the source line 30 and the N-electrode 18 is electrically connected to the ground line 40.

Figure 3B:
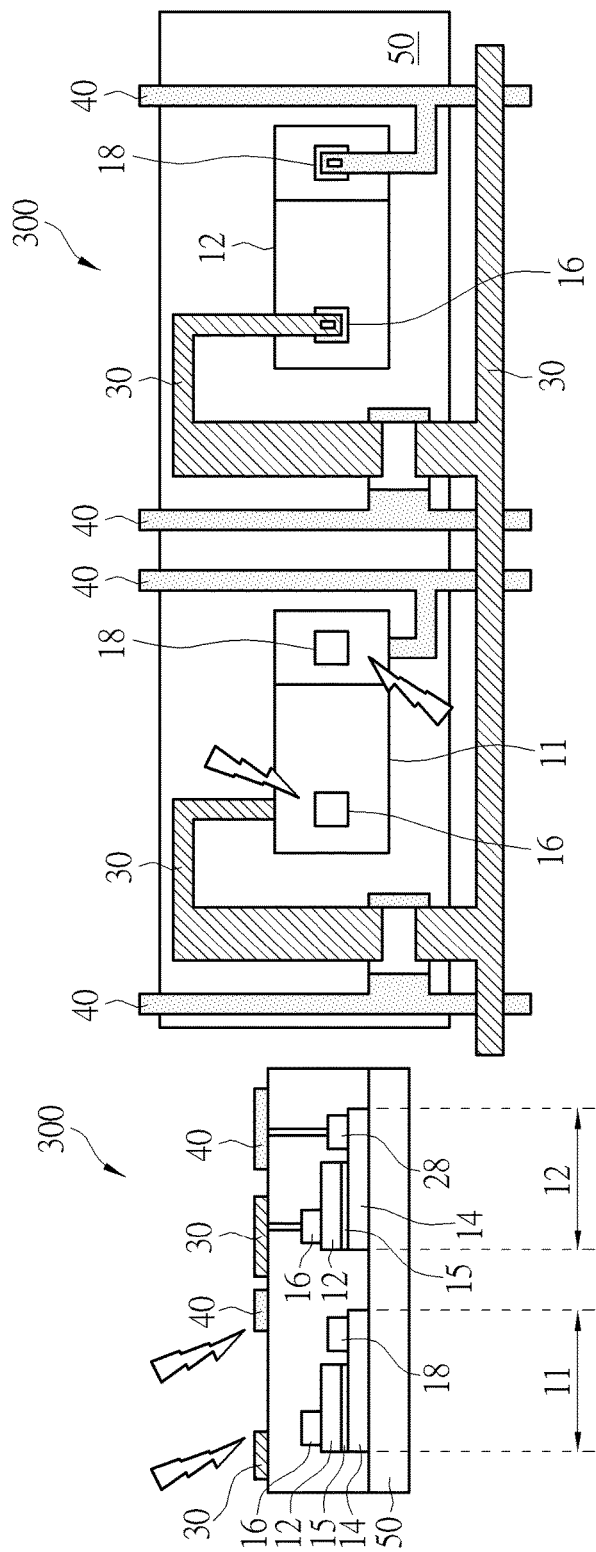
FIGS. 3B-3D are diagrams illustrating a method of repairing a micro lighting device according to another embodiment of the present invention.
Figure 3C:
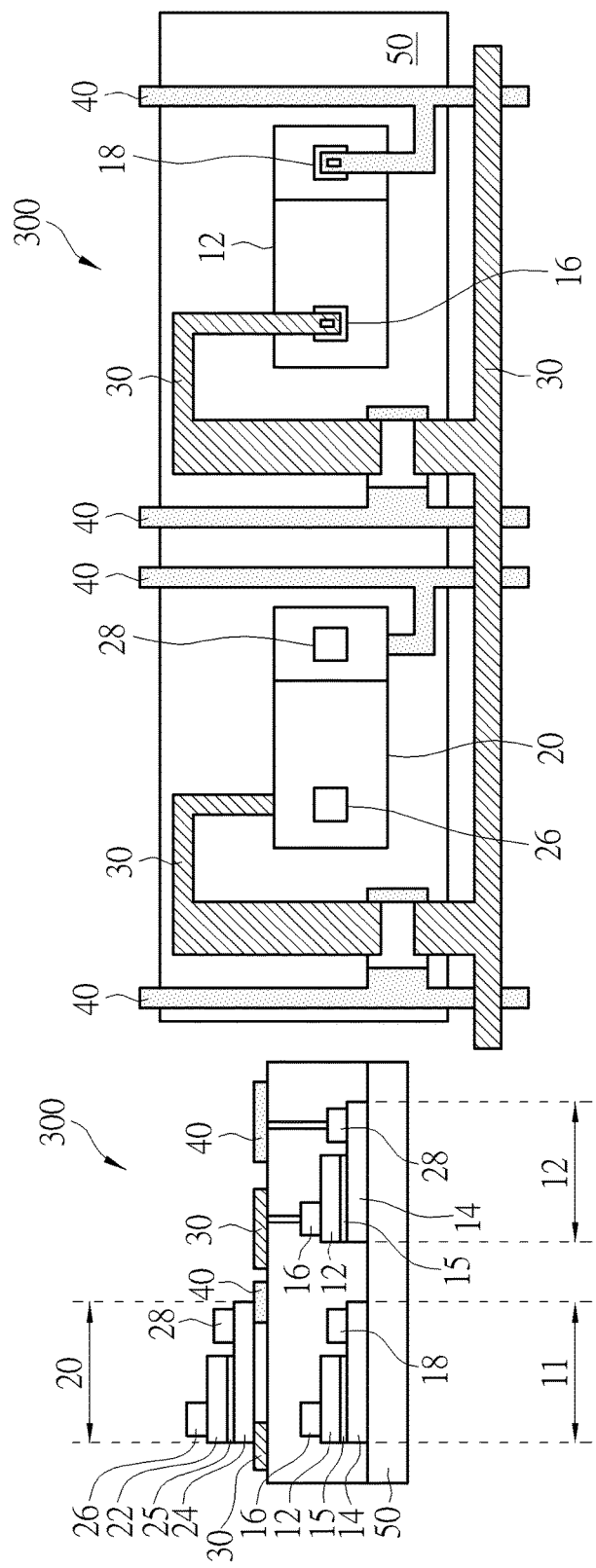
Figure 3D:
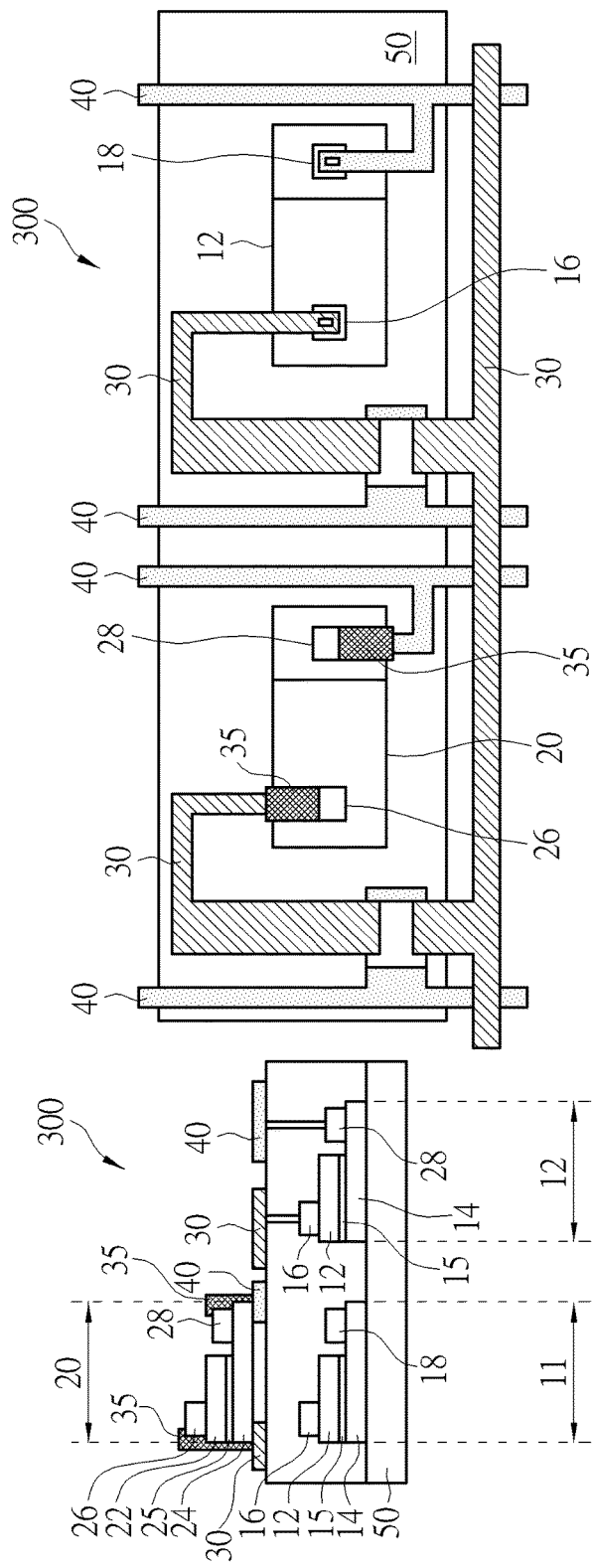

FIGS. 3B-3D are diagrams illustrating a method of repairing the micro lighting device 300 according to an embodiment of the present invention. A cross-sectional diagram of the repaired micro lighting device 300 is depicted on the left side of FIGS. 3B-3D, and a top-view diagram of the repaired micro lighting device 300 is depicted on the right side of FIGS. 3B-3D, wherein the repair locations are designated by flash signs. For illustrative purpose, it is assumed that the main luminescent device 11 in FIG. 3A somehow malfunctions and is unable to light up when applying voltages to its P-electrode 16 and its N-electrode 18, while the normal main luminescent device 12 is able to light up when applying voltages to its P-electrode 16 and its N-electrode 18. As depicted in FIG. 3B, the electrical connection between the P-electrode 16 of the main luminescent device 11 and the source line 30 and the electrical connection between the N-electrode 18 of the main luminescent device 11 and the ground line 40 may be cut off using laser cutting technique so as to prevent leakage current from the flawed main luminescent device 11. Next as depicted in FIG. 3C, a redundant luminescent device 20 may be fabricated by combining P-type and N-type semiconductor materials before being transferred to be displaced on the main luminescent device 11. The redundant luminescent device 20 includes a P-type semiconductor layer 22, an N-type semiconductor layer 24, a P-electrode 26, an n-electrode 28, and a luminescent layer 25. Next as depicted in FIG. 3D, conductive material 35 may be deposited on the redundant luminescent device 20 so that the P-electrode 26 and the n-electrode 28 may be electrically connected to the source line 30 and the ground line 40, respectively. Therefore, the normal redundant luminescent device 20 may light up to replace the flawed main luminescent device 11.

In an embodiment of the present invention, the conductive material 35 may be tantalum, molybdenum or tungsten metal which may be welded to the electrodes of the redundant luminescent device 20 in a laser metal transfer (LMT) process. In another embodiment of the present invention, the conductive material 35 may be Ni(CO)4, Fe(CO)5, Cr(CO)6, Mo(CO)6, or W(CO)6 metal compounds which may be deposited on the electrodes of the redundant luminescent device 20 in a laser chemical vapor deposition (LCVD) process. However, the type of the conductive material 35 does not limit the scope of the present invention.

In conclusion, the present invention provides a micro lighting device with repair mechanism. In addition to good performances regarding power consumption, brightness, resolution, color saturation, reaction speed, life time and efficiency, the present micro lighting device can also improve manufacturing yield using the repair mechanism.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A micro lighting device, comprising:
a source line;
a ground line;
a main luminescent device comprising a first electrode and a second electrode, wherein:
  the first electrode is electrically connected to the source line and the second electrode is electrically connected to the ground line when the main luminescent device is able to light up;
  at least one of the first electrode and the second electrode is electrically isolated from both the source line and the ground line when the main luminescent device is unable to light up; and
a redundant luminescent device comprising a third electrode and a fourth electrode, wherein:
  at least one of the third electrode and the fourth electrode is electrically isolated from both the source line and the ground line when the main luminescent device is able to light up; and
  the third electrode is electrically connected to the source line and the fourth electrode is electrically connected to the ground line when the main luminescent device is unable to light up.
2. The micro lighting device of claim 1, wherein:
the main luminescent device further comprises:
  a first semiconductor layer of a first doping type, wherein the first electrode is disposed on the first semiconductor layer;
  a first luminescent layer disposed on the first semiconductor layer; and
  a second semiconductor layer of a second doping type disposed on the first luminescent layer, wherein the second electrode is disposed on the second semiconductor layer;
the redundant luminescent device further comprises:
  a third semiconductor layer of the first doping type, wherein the third electrode is disposed on the third semiconductor layer;
  a second luminescent layer disposed on the third semiconductor layer; and
  a fourth semiconductor layer of the second doping type disposed on the second luminescent layer, wherein the fourth electrode is disposed on the fourth semiconductor layer; and
the main luminescent device and the redundant luminescent device are fabricated and then transferred to be disposed on a substrate.
3. The micro lighting device of claim 1, wherein the main luminescent device and the redundant luminescent device are micro light emitting diodes (LEDs).
4. A micro lighting device, comprising:
a source line;
a ground line;
a main luminescent device comprising a first electrode and a second electrode, wherein:

the first electrode is electrically connected to the source line and the second electrode is electrically connected to the ground line when the main luminescent device is able to light up;

both the first electrode and the second electrode are electrically isolated from both the source line and the ground line when the main luminescent device is unable to light up;

a redundant luminescent device comprising a third electrode and a fourth electrode and arranged to be disposed on the main luminescent device when the main luminescent device is unable to light up; and a conductive material for electrically connecting the third electrode to the source line and for electrically connecting the fourth electrode to the ground line.

5. The micro lighting device of claim 4, wherein:

the main luminescent device further comprises:
 a first semiconductor layer of a first doping type, wherein the first electrode is disposed on the first semiconductor layer;
 a first luminescent layer disposed on the first semiconductor layer; and
 a second semiconductor layer of a second doping type disposed on the first luminescent layer, wherein the second electrode is disposed on the second semiconductor layer;

the redundant luminescent device further comprises:
 a third semiconductor layer of the first doping type, wherein the third electrode is disposed on the third semiconductor layer;
 a second luminescent layer disposed on the third semiconductor layer; and
 a fourth semiconductor layer of the second doping type disposed on the second luminescent layer, wherein the fourth electrode is disposed on the fourth semiconductor layer;

the main luminescent device is fabricated and then transferred to be disposed on a substrate; and the redundant luminescent device is fabricated and then transferred to be disposed on the main luminescent device.

6. The micro lighting device of claim 4, wherein the main luminescent device and the redundant luminescent device are micro LEDs.

7. A method of manufacturing and repairing micro lighting device, comprising:

fabricating a main luminescent device which includes a first electrode and a second electrode and then transferring the main luminescent device to be disposed on a substrate;

fabricating a redundant luminescent device which includes a third electrode and a fourth electrode and then transferring the redundant luminescent device to be disposed on the substrate;

electrically connecting the first electrode to a source line, electrically connecting the second electrode to a ground line, and electrically isolating at least one of the third electrode and the fourth electrode from both the source line and the ground line when the main luminescent device is able to light up; and electrically isolating at least one of the first electrode and the second electrode from both the source line and the ground line, electrically connecting the third electrode to the source line, and electrically connecting the fourth electrode to the ground line when the main luminescent device is unable to light up.

8. The method of claim 7, wherein:

fabricating the main luminescent device comprises:
 disposing a first luminescent layer and the first electrode on a first semiconductor layer of a first doping type;
 disposing a second semiconductor layer of a second doping type on the first luminescent layer; and
 disposing the second electrode on the second semiconductor layer; and fabricating the redundant luminescent device comprises:
 disposing a second luminescent layer and the third electrode on a third semiconductor layer of the first doping type;
 disposing a fourth semiconductor layer of the second doping type on the second luminescent layer; and
 disposing the fourth electrode on the fourth semiconductor layer.

9. A method of manufacturing and repairing micro lighting device, comprising:

fabricating a main luminescent device which includes a first electrode and a second electrode;

fabricating a redundant luminescent device which includes a third electrode and a fourth electrode;

transferring the main luminescent device to be disposed on a substrate;

electrically connecting the first electrode to a source line and electrically connecting the second electrode to a ground line when the main luminescent device is able to light up;

electrically isolating at least one of the first electrode and the second electrode from both the source line and the ground line when the main luminescent device is able to light up;

disposing the redundant luminescent device on the main luminescent device; and disposing a conductive material for electrically connecting the third electrode to the source line and for electrically connecting the fourth electrode to the ground line.

10. The method of claim 9, wherein:

fabricating the main luminescent device comprises:
 disposing a first luminescent layer and the first electrode on a first semiconductor layer of a first doping type;
 disposing a second semiconductor layer of a second doping type on the first luminescent layer; and
 disposing the second electrode on the second semiconductor layer; and fabricating the redundant luminescent device comprises:
 disposing a second luminescent layer and the third electrode on a third semiconductor layer of the first doping type;
 disposing a fourth semiconductor layer of the second doping type on the second luminescent layer; and
 disposing the fourth electrode on the fourth semiconductor layer.

* * * * *